United States Patent
Ma et al.

(10) Patent No.: US 12,382,600 B2
(45) Date of Patent: Aug. 5, 2025

(54) ELECTRONIC DEVICE HOUSING, MANUFACTURING METHOD THEREOF, AND ELECTRONIC DEVICE

(71) Applicant: BYD COMPANY LIMITED, Shenzhen (CN)

(72) Inventors: Lan Ma, Shenzhen (CN); Haiyan Jin, Shenzhen (CN); Liang Chen, Shenzhen (CN)

(73) Assignee: BYD COMPANY LIMITED, Shenzhen (CN)

( * ) Notice: Subject to any disclaimer, the term of this patent is extended or adjusted under 35 U.S.C. 154(b) by 896 days.

(21) Appl. No.: 17/418,530

(22) PCT Filed: Apr. 29, 2019

(86) PCT No.: PCT/CN2019/085006
§ 371 (c)(1),
(2) Date: Jun. 25, 2021

(87) PCT Pub. No.: WO2020/133858
PCT Pub. Date: Jul. 2, 2020

(65) Prior Publication Data
US 2022/0104376 A1 Mar. 31, 2022

(30) Foreign Application Priority Data
Dec. 29, 2018 (CN) .......................... 201811642127.8

(51) Int. Cl.
*H05K 5/03* (2006.01)
*H04B 1/3888* (2015.01)

(52) U.S. Cl.
CPC ............. *H05K 5/03* (2013.01); *H04B 1/3888* (2013.01)

(58) Field of Classification Search
None
See application file for complete search history.

(56) References Cited

U.S. PATENT DOCUMENTS 3,210,171 A * 10/1965 MacDonald ............... H01J 5/20
65/153
4,571,921 A * 2/1986 Wolfson ............ B29C 66/24244
156/379.7
(Continued)

FOREIGN PATENT DOCUMENTS

CN 106341962 A 1/2017
CN 106746540 A 5/2017
(Continued)

OTHER PUBLICATIONS

Machine translation of CN-107057878-A, Jun. 2024 (Year: 2024).*
(Continued)

*Primary Examiner* — Geoffrey S Evans
(74) *Attorney, Agent, or Firm* — Wenye Tan (57) ABSTRACT

An electronic device housing, a manufacturing method thereof, and an electronic device are provided. The housing includes a bottom plate, and a middle frame connected to the bottom plate. The middle frame is made of glass, and the bottom plate is made of sapphire; or the bottom plate is made of glass, and the middle frame is made of sapphire. An interface-free continuous connection is provided between the bottom plate and the middle frame.

6 Claims, 3 Drawing Sheets

(56) References Cited

U.S. PATENT DOCUMENTS

| | | | |
|---|---|---|---|
| 2013/0188301 A1 | 7/2013 | Tanaka | |
| 2013/0236699 A1 | 9/2013 | Prest et al. | |
| 2014/0162043 A1 | 6/2014 | Schmid | |
| 2014/0355179 A1* | 12/2014 | Little | H04M 1/0202 156/273.1 |
| 2016/0270247 A1* | 9/2016 | Jones | B32B 17/06 |
| 2018/0086026 A1* | 3/2018 | Nguyen | B32B 7/10 |

FOREIGN PATENT DOCUMENTS

| | | |
|---|---|---|
| CN | 206224339 U | 6/2017 |
| CN | 107057878 A * | 8/2017 |
| CN | 108540610 A | 9/2018 |
| CN | 108911493 A | 11/2018 |
| EP | 1360883 B1 | 3/2012 |
| JP | 2016016996 A | 2/2016 |
| WO | 2015077925 A1 | 6/2015 |
| WO | 2017036169 A1 | 3/2017 |

OTHER PUBLICATIONS

The World Intellectual Property Organization (WIPO) International Search Report for PCT/CN2019/085006 Aug. 15, 2019 5 pages (with translation).

* cited by examiner

ELECTRONIC DEVICE HOUSING, MANUFACTURING METHOD THEREOF, AND ELECTRONIC DEVICE

CROSS-REFERENCE TO RELATED APPLICATIONS

The present application is a national phase entry under 35 U.S.C. § 371 of International Application No. PCT/CN2019/085006, filed on Apr. 29, 2019, which is based upon and claims priority to Chinese Patent Application No. 201811642127.8, filed on Dec. 29, 2018, the entire content of all of which is incorporated herein by reference in its entirety.

FIELD

The present disclosure relates to an electronic device housing, a manufacturing method thereof, and an electronic device.

BACKGROUND

In recent years, with the rise of 5G and wireless charging technology, signal requirements for mobile electronic devices become increasingly higher, the disadvantages of metal electromagnetic shielding are increasingly prominent, glass and ceramic back covers come into being, and electronic device cover plates and display screens have gradually transited from conventional metal back covers, plastic back covers, and plastic display screens to all-glass or sapphire or ceramic materials. Due to good visual effects and touch hand feelings, the application of the 3D glass housings to mobile phones, smart watches, and other electronic devices has become a trend. 3D glass electronic housings reported currently adopt either an all-glass structure or an all-sapphire structure. Sapphire-glass composite housing structures are rarely reported.

SUMMARY

The present disclosure provides an electronic device housing adopting a sapphire-glass composite structure, a manufacturing method of the electronic device housing, and an electronic device.

To achieve the above objects, according to a first aspect of the present disclosure, an electronic device housing is provided. The housing includes a bottom plate, and a middle frame connected to the bottom plate. The middle frame is made of glass, and the bottom plate is made of sapphire. Or, the bottom plate is made of glass, and the middle frame is made of sapphire. An interface-free continuous connection is provided between the bottom plate and the middle frame.

In some embodiments, the bottom plate is connected to the middle frame in a welding mode.

In some embodiments, a bonding strength between the bottom plate and the middle frame is not lower than a lower one of a pull strength of the bottom plate and a pull strength of the middle frame, and a light transmittance of the housing is not lower than 80%.

In some embodiments, the bottom plate is provided with a camera hole and a camera lens, the camera lens is connected to the camera hole through an annular boss, and the annular boss is made of sapphire or glass.

In some embodiments, an interface-free continuous connection is provided between an edge of the camera lens and the annular boss, and a bonding strength between the annular boss and the camera lens is not lower than a lower one of a pull strength of the annular boss and a pull strength of the camera lens.

According to a second aspect of the present disclosure, a method for manufacturing an electronic device housing is provided. The method includes: cleaning surfaces of components to be welded to obtain surface-cleaned components, and assembling, pre-pressurizing, and welding the surface-cleaned components, so that an interface-free continuous connection is provided between the components to be welded. The component to be welded includes at least a middle frame and a bottom plate. The middle frame is made of glass, and the bottom plate is made of sapphire. Or, the bottom plate is made of glass, and the middle frame is made of sapphire.

In some embodiments, the component to be welded further includes at least a camera lens and an annular boss.

In some embodiments, the method further includes: welding the camera lens on the annular boss to obtain a camera structure, and then welding the camera structure and the bottom plate, so that the camera structure is bonded at a camera hole formed in the bottom plate, the annular boss being made of sapphire or glass.

In some embodiments, the surface cleaning includes: cleaning the components to be welded with a cleaning agent respectively, and then cleaning the components to be welded with pure water. In some embodiments, the cleaning agent includes a surfactant, an emulsifier, and a strong base. The surfactant includes at least one of sodium dodecyl benzene sulfonate, sodium dodecyl sulfonate, and sodium dodecyl sulfate. The emulsifier includes triethanolamine. The strong base includes at least one of sodium hydroxide, potassium hydroxide, and calcium hydroxide. A weight ratio of the surfactant to the emulsifier to the strong base is 1:(0.2-2):(0.5-5).

In some embodiments, the pre-pressurization is carried out in a pressurizing device with a first heating plate and a second heating plate, the first heating plate can be in contact with the glass component to be welded, the second heating plate can be in contact with the sapphire component to be welded, and the temperature of the first heating plate is higher than that of the second heating plate. In some embodiments, the temperature of the first heating plate is 50-100° C. higher than that of the second heating plate. The pressurizing device is filled with inert gas. The pre-pressurization sequentially includes the following stages: a first stage in which the pressure is 0.4-0.6 MPa, the time is 0.5-2 h, the temperature of the first heating plate is not higher than 200° C., and the temperature of the second heating plate is not higher than 100° C.; a second stage in which the pressure is 0.8-1.2 MPa, the time is 0.5-2 h, the temperature of the first heating plate is not higher than 300° C., and the temperature of the second heating plate is not higher than 200° C.; and a third stage in which the pressure is 1.4-1.6 MPa, the time is 0.5-2 h, the temperature of the first heating plate is not higher than 400° C., and the temperature of the second heating plate is not higher than 300° C.

In some embodiments, the welding conditions include: the temperature is 400-800° C., the pressure is 0-5 MPa, and the time is 6-12 h.

According to a third aspect of the present disclosure, an electronic device housing manufactured using the method described in the second aspect of the present disclosure is provided.

Through the above technical solution, the electronic device housing of the present disclosure, made of a sapphire-glass composite material, is high in hardness, wear-resistant, not easy to deform structurally, has a visual effect and a touch hand feeling similar to those of an all-glass or all-sapphire housing, is low in manufacturing cost, and can be produced on a large scale.

Other features and advantages of the present disclosure will be described in detail in the following detailed description part.

BRIEF DESCRIPTION OF THE DRAWINGS

The accompanying drawings are intended to provide further understanding of the present disclosure and constitute a part of this specification. The accompanying drawings and the specific implementations below are used together for explaining the present disclosure rather than constituting a limitation to the present disclosure. In the drawings.

DETAILED DESCRIPTION

Specific implementations of the present disclosure are described in detail below with reference to the accompanying drawings. It should be understood that the specific implementations described herein are merely used to describe and explain the present disclosure, but are not intended to limit the present disclosure.

Figure 1:
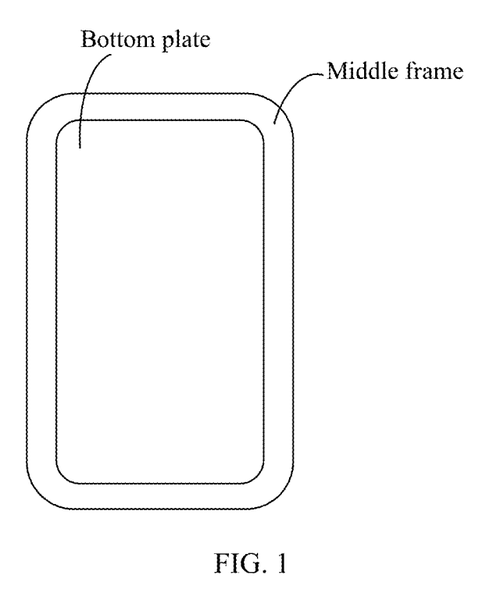
FIG. 1 illustrates a line drawing of a housing manufactured in Embodiment 1.
Figure 3:
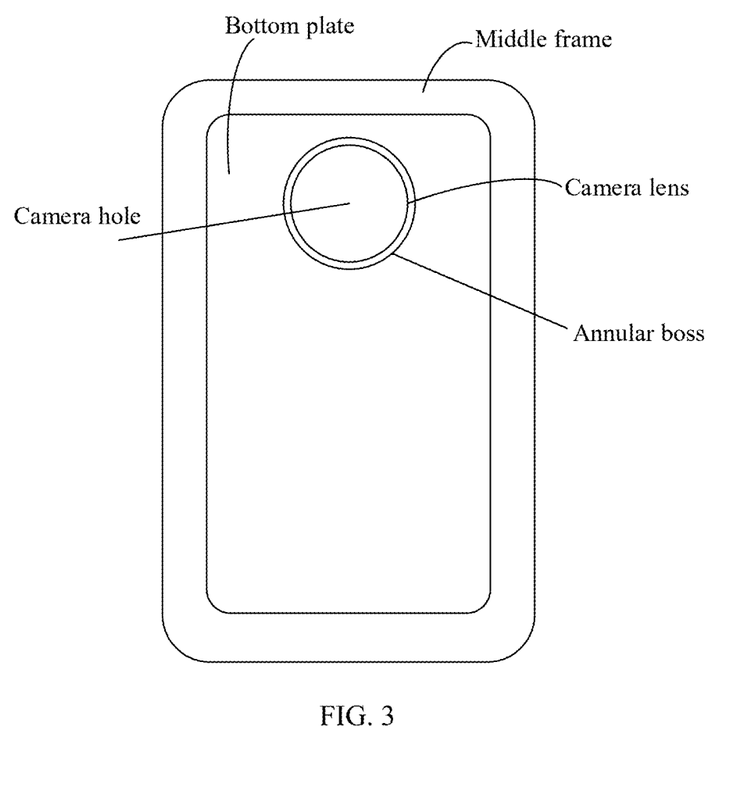
FIG. 3 illustrates another line drawing of a housing.

According to a first aspect of the present disclosure, as shown in FIG. 1 and FIG. 3, an electronic device housing is provided. The housing includes a bottom plate, and a middle frame connected to the bottom plate. An interface-free continuous connection is provided between the bottom plate and the middle frame.

According to the present disclosure, the middle frame is generally in a ring shape matched with the shape of the bottom plate, and is connected to the bottom plate to form a box-type structure housing with an open upper end. A connection position relationship between the middle frame and the bottom plate is not particularly limited. For example, the middle frame may wrap the bottom plate, i.e. an inner side face of the middle frame is connected to an outer side face of an outer peripheral edge of the bottom plate, or, a lower surface of the middle frame is connected to an upper surface of the outer peripheral edge of the bottom plate.

In an implementation of the first aspect of the present disclosure, the middle frame is made of glass, and the bottom plate is made of sapphire. The housing in the present implementation has the advantages of high global hardness and wear resistance.

In another implementation of the first aspect of the present disclosure, the bottom plate is made of glass, and the middle frame is made of sapphire. The housing in the present implementation has a better frame strength and is not easy to deform structurally.

According to the present disclosure, the glass is not particularly limited in type, and may be, for example, high-alumina glass, silicate glass, borate glass, etc. The sapphire may be natural sapphire or synthetic sapphire.

According to the present disclosure, the interface-free continuous connection means that although the bottom plate and the middle frame are not made of the same material in the above two implementations, a connection joint between the bottom plate and the middle frame is visually continuous and interface-free. The interface-free continuous connection may be implemented by welding the materials of the bottom plate and the middle frame, i.e. the bottom plate is connected to the middle frame in a welding mode. In this way, a bonding strength between the bottom plate and the middle frame of the electronic device housing of the present disclosure is high. According to some embodiments of the present disclosure, the bonding strength between the bottom plate and the middle frame is not lower than a lower one of a pull strength of the bottom plate and a pull strength of the middle frame. That is, the bonding strength between the bottom plate and the middle frame is higher than the pull strength of the bottom plate being pulled apart before the bottom plate and the middle frame are composited, and also higher than the pull strength of the middle frame being pulled apart. Moreover, the overall light transmittance of the housing is high. For example, the light transmittance of the housing may be not lower than 80%.

According to the present disclosure, as shown in FIG. 3, the bottom plate may be provided with a camera hole and a camera lens, the camera lens is connected to the camera hole through an annular boss, and the annular boss is made of sapphire or glass. The camera lens may be made of sapphire or glass. According to some embodiments of the present disclosure, an interface-free continuous connection may also be provided between an edge of the camera lens and an edge of the annular boss. At this moment, a bonding strength between the annular boss and the camera lens is not lower than a lower one of a pull strength of the annular boss and a pull strength of the camera lens. That is, the bonding strength between the annular boss and the camera lens is higher than the pull strength of the bottom plate being pulled apart before the annular boss and the camera lens are composited, and also higher than the pull strength of the camera lens being pulled apart.

According to a second aspect of the present disclosure, a method for manufacturing an electronic device housing is provided. The housing includes a bottom plate, and a middle frame connected to the bottom plate. The housing is further provided with a camera hole and a camera lens.

According to the second aspect of the present disclosure, the method includes the following steps. Surfaces of components to be welded are cleaned to obtain surface-cleaned components, and the surface-cleaned components are assembled, pre-pressurized, and welded, so that an interface-free continuous connection is provided between the components to be welded. The component to be welded includes at least a middle frame and a bottom plate. The middle frame is made of glass, and the bottom plate is made of sapphire. Or, the bottom plate is made of glass, and the middle frame is made of sapphire. The glass is not particularly limited in type in the present disclosure, and may be, for example, high-alumina glass, silicate glass, or borate glass. The sapphire may be natural sapphire or synthetic sapphire.

The middle frame and the bottom plate in the present disclosure are not particularly limited in size. For example, a peripheral size of the middle frame may be consistent with that of the bottom plate or slightly larger than that of the bottom plate, and the peripheral size of the middle frame may also be smaller than the size of the bottom plate as long as a certain overlapping area exists between the middle frame and the bottom plate when being superposed. The middle frame and the bottom plate are connected through welding, and thus an integrated structure of the middle frame and the bottom plate can be implemented, i.e. an interface-free continuous connection is provided between the bottom plate and the middle frame. The manufacturing cost is low, and large-scale production can be realized.

According to a second aspect of the present disclosure, in some embodiments, the component to be welded further includes at least a camera lens and an annular boss. The annular boss may be made of sapphire or glass, and the camera lens may be made of glass. The method may further include the following steps. The camera lens is welded on the annular boss to obtain a camera structure, and then the camera structure and the bottom plate are welded, so that the camera structure is bonded at a camera hole formed in the bottom plate.

According to some embodiments of the present disclosure, the surface cleaning may include the following operations. The components to be welded are cleaned with a cleaning agent respectively, and then cleaned with pure water. The cleaning agent may remove greasy dirt impurities on the components to be welded, and the residual cleaning agent may be cleaned off with the pure water. According to some embodiments of the present disclosure, the cleaning agent may include a surfactant, an emulsifier, and a strong base. The surfactant may include at least one of sodium dodecyl benzene sulfonate, sodium dodecyl sulfonate, and sodium dodecyl sulfate. The emulsifier may include triethanolamine. The strong base may include at least one of sodium hydroxide, potassium hydroxide, and calcium hydroxide. A weight ratio of the surfactant to the emulsifier to the strong base may be 1:(0.2-2):(0.5-5).

According to the second aspect of the present disclosure, the process of superposing the surface-cleaned middle frame and the surface-cleaned bottom plate may be carried out in a dust-free environment, so as to prevent the surface-cleaned middle frame and bottom plate from being polluted by dust impurities, etc.

According to some embodiments of the present disclosure, the pre-pressurization may be carried out in a pressurizing device with a first heating plate and a second heating plate. The first heating plate can be in contact with the glass component to be welded. The second heating plate can be in contact with the sapphire component to be welded. The temperature of the first heating plate is higher than that of the second heating plate. In some embodiments, the temperature of the first heating plate is 50-100° C. higher than that of the second heating plate. The pressurizing device is filled with inert gas (e.g., helium or argon). The pre-pressurization sequentially includes the following stages: a first stage in which the pressure is 0.4-0.6 MPa, the time is 0.5-2 h, the temperature of the first heating plate is not higher than 200° C., and the temperature of the second heating plate is not higher than 100° C.; a second stage in which the pressure is 0.8-1.2 MPa, the time is 0.5-2 h, the temperature of the first heating plate is not higher than 300° C., and the temperature of the second heating plate is not higher than 200° C.; and a third stage in which the pressure is 1.4-1.6 MPa, the time is 0.5-2 h, the temperature of the first heating plate is not higher than 400° C., and the temperature of the second heating plate is not higher than 300° C.

According to the second aspect of the present disclosure, the above pre-pressurization prior to the welding is advantageous for further improving the bonding strength between different components and the bending strength of the manufactured housing.

According to the second aspect of the present disclosure, after the pre-pressurization is carried out according to the above steps, the temperature may be continuously increased in the pressurizing device to reach the temperature of the welding, and then the welding is carried out. The welding conditions may include: the temperature is 400-800° C. In some embodiments, the temperature is 500-800° C., and the pressure is 0-5 MPa. In some embodiments, the pressure is 0.5-4 MPa, and the time is 6-12 h. Finally, the temperature is slowly reduced to room temperature, and the middle frame and the bottom plate are taken out, thereby finishing the welding process. The above pressure refers to the pressure between different components at the time of carrying out the pre-pressurization or welding.

According to the second aspect of the present disclosure, the method may further include the following step. The bottom plate, the middle frame, and the camera lens in target shapes are obtained through computer numerical control (CNC) cutting or laser cutting respectively. The specific operation steps of the CNC cutting or laser cutting are well known to those skilled in the art, and are not particularly limited in the present disclosure.

According to a third aspect of the present disclosure, an electronic device housing manufactured using the method described in the second aspect of the present disclosure is provided. A bonding strength between the bottom plate and the middle frame of the electronic device housing manufactured using the method in the second aspect of the present disclosure is high, and a bonding strength between the annular boss and the camera lens is high. According to some embodiments of the present disclosure, the bonding strength between the bottom plate and the middle frame is not lower than a lower one of a pull strength of the bottom plate and a pull strength of the middle frame. That is, the bonding strength between the bottom plate and the middle frame is higher than the pull strength of the bottom plate being pulled apart before the bottom plate and the middle frame are composited, and also higher than the pull strength of the middle frame being pulled apart; the bonding strength between the annular boss and the camera lens is not lower than a lower one of a pull strength of the annular boss and a pull strength of the camera lens. That is, the bonding strength between the annular boss and the camera lens is higher than the pull strength of the bottom plate being pulled apart before the annular boss and the camera lens are composited, and also higher than the pull strength of the camera lens being pulled apart. Moreover, the overall light transmittance of the housing is high. For example, the light transmittance of the housing may be not lower than 80%.

The present disclosure is further illustrated by the following embodiments. However, the present disclosure is not limited in any way thereby.

A high-alumina glass plate used in the embodiments is obtained from Corning (the compositions include $Al_2O_3$, $SiO_2$, and $Na_2O$, the softening point is 900° C., the annealing point is 628° C., the strain point is 574° C., the Vickers hardness is 534 kgf/mm$^2$, the expansion coefficient is 75.8×$10^{-7}$/° C., and the pull strength is 0.66 MPa). A sapphire plate is obtained from Chongqing Shuzhou Technology Co., Ltd. (the composition is $Al_2O_3$, the specific gravity is 3.98 g/cm$^3$, the melting point is 2,040° C., the Vickers hardness is 2200 kgf/mm$^2$, the expansion coefficient is 7.5×$10^{-6}$/° C., and the pull strength is 400 MPa). A PVB film is purchased from Shanghai Huzheng Nano Technology Co., Ltd. and has a thickness of 0.38 mm.

In the embodiments, CNC cutting is carried out by using a JDLGC230 device produced by Beijing Carving Company, and laser cutting is carried out by using an MPS-0303L device produced by HAN'S Group Company.

Embodiment 1

In the present embodiment, a middle frame blank was a high-alumina glass plate, and a bottom plate was made of sapphire.

The middle frame was machined from the glass plate through CNC. The bottom plate with a target size was obtained from the sapphire plate through CNC.

Surfaces of the middle frame and the bottom plate were cleaned with a cleaning agent. The cleaning agent was a mixture of sodium dodecyl benzene sulfonate, triethanolamine, and sodium hydroxide (a weight ratio was 1:1:3). Then, the surfaces of the middle frame and the bottom plate were cleaned with pure water to obtain a surface-cleaned middle frame and a surface-cleaned bottom plate. The surface-cleaned middle frame and the surface-cleaned bottom plate were superposed in a dustless environment and arranged in a pressurizing device with a first heating plate and a second heating plate. The first heating plate could be in contact with the glass middle frame, and the second heating plate could be in contact with the sapphire bottom plate. The pressurizing device was filled with inert gas (helium). The pre-pressurization was sequentially carried out according to the following stages: a first stage in which the pressure was 0.5 MPa, the time was 1 h, the temperature of the first heating plate was 100° C., and the temperature of the second heating plate was 50° C.; a second stage in which the pressure was 1.0 MPa, the time was 1 h, the temperature of the first heating plate was 200° C., and the temperature of the second heating plate was 150° C.; and a third stage in which the pressure was 1.5 MPa, the time was 1 h, the temperature of the first heating plate was 300° C., and the temperature of the second heating plate was 250° C. Then, the temperature of the first heating plate was increased to 700° C., the temperature of the second heating plate was increased to 700° C., the pressure was increased to 2 MPa and kept for 7 h, and welding was carried out. Finally, the temperature was slowly reduced to room temperature, and the middle frame and the bottom plate were taken out, thereby finishing the welding process to obtain a housing manufactured in the present embodiment. An interface-free continuous connection was provided between the bottom plate and the middle frame of the housing, which had a visual effect and a touch hand feeling similar to those of an all-glass or all-sapphire housing, as shown in FIG. 1 specifically.

Embodiment 2

In the present embodiment, a bottom plate was made of glass, and a middle frame was made of sapphire.

The shape of the bottom plate was machined from the glass plate through CNC, and the middle frame was machined from the sapphire plate through laser cutting.

The bottom plate and the middle frame were cleaned with a cleaning agent. The cleaning agent was a mixture of sodium dodecyl sulfonate, triethanolamine, and potassium hydroxide (a weight ratio was 1:1:4). Then, the middle frame and the bottom plate were cleaned with pure water to obtain a surface-cleaned middle frame and a surface-cleaned bottom plate. The surface-cleaned middle frame and the surface-cleaned bottom plate were superposed in a dustless environment, the bottom plate was arranged in a pressurizing device with a first heating plate and a second heating plate. The first heating plate could be in contact with the glass bottom plate, and the second heating plate could be in contact with the sapphire middle frame. The pressurizing device was filled with inert gas (helium). The pre-pressurization was sequentially carried out according to the following stages: a first stage in which the pressure was 0.5 MPa, the time was 1 h, the temperature of the first heating plate was 150° C., and the temperature of the second heating plate was 80° C.; a second stage in which the pressure was 1.0 MPa, the time was 1 h, the temperature of the first heating plate was 250° C., and the temperature of the second heating plate was 180° C.; and a third stage in which the pressure was 1.5 MPa, the time was 1 h, the temperature of the first heating plate was 350° C., and the temperature of the second heating plate was 280° C. Then, the temperature of the first heating plate was increased to 750° C., the temperature of the second heating plate was increased to 650° C., the pressure was increased to 3.5 MPa and kept for 10 h, and welding was carried out. Finally, the temperature was slowly reduced to room temperature, and the middle frame and the bottom plate were taken out, thereby finishing the welding process to obtain a housing manufactured in the present embodiment. An interface-free continuous connection was provided between the bottom plate and the middle frame of the housing, which had a visual effect and a touch hand feeling similar to those of an all-glass or all-sapphire housing.

Embodiment 3

In the present embodiment, a bottom plate was made of sapphire, a middle frame blank was a high-alumina glass plate, and an annular boss and a top lens of a camera were made of glass.

The middle frame was machined from the glass plate through CNC cutting, the shape of the bottom plate was machined from the sapphire plate through laser cutting, the annular boss was machined from a glass block through CNC, and the shape of the top glass lens was machined through CNC.

The bottom plate, the middle frame, the top lens, and the annular boss were cleaned with a cleaning agent. The cleaning agent was a mixture of sodium dodecyl benzene sulfonate, triethanolamine, and sodium hydroxide (a weight ratio was 1:1.5:4). Then, the bottom plate, the middle frame, the top lens, and the annular boss were cleaned with pure water to obtain a surface-cleaned bottom plate, middle frame, top lens, and annular boss. The surface-cleaned glass top lens was in contact with one end of the glass annular boss in a dustless environment, and the top lens and the annular boss were welded together at 700° C. under the pressure of 1.5 Mpa to form a non-through-hole camera structure. The welded camera structure was cleaned with a cleaning agent. The cleaning agent was a mixture of sodium dodecyl benzene sulfonate, triethanolamine, and sodium hydroxide (a weight ratio was 1:1.5:4). Then, the welded camera structure was cleaned with pure water to obtain a surface-cleaned camera structure. The surface-cleaned camera structure, the sapphire bottom plate, and the glass middle frame were arranged in a pressurizing device with a first heating plate and a second heating plate in a dustless environment. The first heating plate could be in contact with the glass middle frame, and the second heating plate could be in contact with the sapphire bottom plate. The pressurizing device was filled with inert gas (helium). The pre-pressurization was sequentially carried out according to the following stages: a first stage in which the pressure was 0.5 MPa, the time was 1 h, the temperature of the first heating plate was 180° C., and the temperature of the second heating plate was 90° C.; a second stage in which the pressure was 1.0 MPa, the time was 1 h, the temperature of the first heating plate was 280° C., and the temperature of the second heating plate was 190° C.; and a third stage in which the pressure was 1.5 MPa, the time was 1 h, the temperature of the first heating plate was 380° C., and the temperature of the second heating plate was 290° C.

Then, the temperature of the first heating plate was increased to 650° C., the temperature of the second heating plate was increased to 650° C., the pressure was increased to 5 MPa and kept for 6 h, and welding was carried out. Finally, the temperature was slowly reduced to room temperature, and the middle frame and the bottom plate were taken out, thereby finishing the welding process to obtain a housing manufactured in the present embodiment. Interface-free continuous connections were provided between the bottom plate and the middle frame of the housing and between an edge of the camera lens and an edge of the annular boss, which had a visual effect and a touch hand feeling similar to those of an all-glass or all-sapphire housing.

Embodiment 4

In the present embodiment, a bottom plate blank was a high-alumina glass plate, a middle frame was made of sapphire, an annular boss of a camera was made of sapphire, and a top lens was made of glass.

The shape of the glass plate was machined through CNC, the shape of the annular boss was machined through CNC, the shape of the top lens was machined through CNC, and the middle frame was machined from the sapphire plate through laser cutting.

Surfaces of the above bottom plate, middle frame, top lens, and annular boss were cleaned with a cleaning agent. The cleaning agent was a mixture of sodium dodecyl benzene sulfonate, triethanolamine, and potassium hydroxide (a weight ratio was 1:1.5:3). Then, the surfaces of the above bottom plate, middle frame, top lens, and annular boss were cleaned with pure water to obtain a surface-cleaned bottom plate, middle frame, top lens, and annular boss. The surface-cleaned top lens was in contact with one end of the sapphire annular boss in a dustless environment and arranged in a pressurizing device with a first heating plate and a second heating plate. The first heating plate could be in contact with the top lens, and the second heating plate could be in contact with the sapphire annular boss. The pressurizing device was filled with inert gas (helium). The pre-pressurization was sequentially carried out according to the following stages: a first stage in which the pressure was 0.5 MPa, the time was 1 h, the temperature of the first heating plate was 200° C., and the temperature of the second heating plate was 100° C.; a second stage in which the pressure was 1.0 MPa, the time was 1 h, the temperature of the first heating plate was 300° C., and the temperature of the second heating plate was 200° C.; and a third stage in which the pressure was 1.5 MPa, the time was 1 h, the temperature of the first heating plate was 400° C., and the temperature of the second heating plate was 300° C. Then, the temperature of the first heating plate was increased to 700° C., the temperature of the second heating plate was increased to 650° C., the pressure was increased to 4 MPa and kept for 6 h, and welding was carried out to obtain a non-through-hole camera structure. The welded camera structure was cleaned with a cleaning agent that was a mixture of sodium dodecyl sulfonate, triethanolamine, and potassium hydroxide (a weight ratio was 1:1.5:3). Then, the welded camera structure was cleaned with pure water to obtain a surface-cleaned camera structure. The cleaned camera structure, the glass bottom plate, and the sapphire middle frame were arranged in a pressurizing device with a first heating plate and a second heating plate in a dustless environment. The first heating plate could be in contact with the bottom plate and the camera structure, and the second heating plate could be in contact with the middle frame. The pressurizing device was filled with inert gas (helium). The pre-pressurization was sequentially carried out according to the following stages: a first stage in which the pressure was 0.5 MPa, the time was 1 h, the temperature of the first heating plate was 200° C., and the temperature of the second heating plate was 100° C.; a second stage in which the pressure was 1.0 MPa, the time was 1 h, the temperature of the first heating plate was 300° C., and the temperature of the second heating plate was 200° C.; and a third stage in which the pressure was 1.5 MPa, the time was 1 h, the temperature of the first heating plate was 400° C., and the temperature of the second heating plate was 300° C. Then, the temperature of the first heating plate was increased to 700° C., the temperature of the second heating plate was increased to 650° C., the pressure was increased to 2 MPa and kept for 8 h, and welding was carried out. Finally, the temperature was slowly reduced to room temperature, and the middle frame and the bottom plate were taken out, thereby finishing the welding process to obtain a housing manufactured in the present embodiment. Interface-free continuous connections were provided between the bottom plate and the middle frame of the housing and between an edge of the camera lens and an edge of the annular boss, which had a visual effect and a touch hand feeling similar to those of an all-glass or all-sapphire housing.

Comparative Example 1

In the present comparative example, a middle frame blank was a high-alumina glass plate, and a bottom plate was made of sapphire.

The middle frame was machined from the glass plate through CNC. The bottom plate with a target size was obtained from the sapphire plate through CNC.

Figure 2:
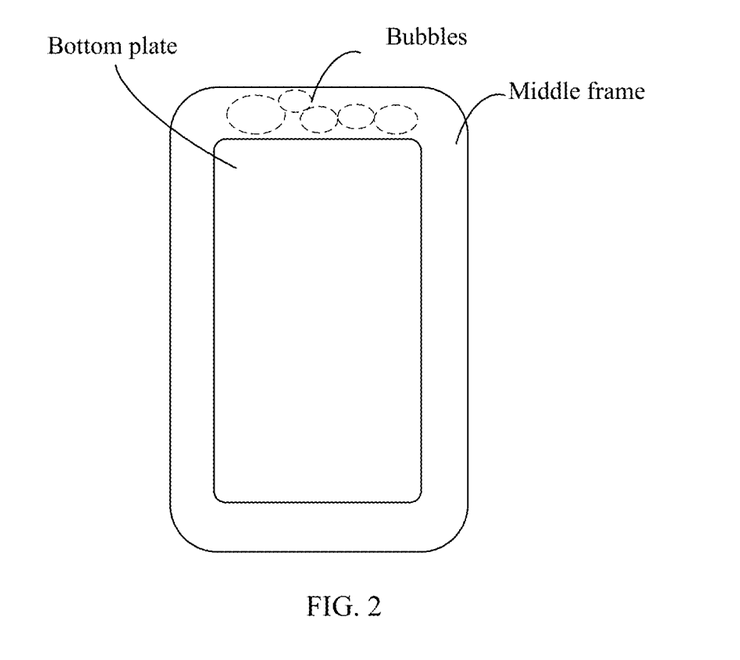
FIG. 2 illustrates a line drawing showing a casing in a preparation of Comparative Example 1.

The middle frame and the bottom plate were superposed, and welded at high temperature of 700° C. to obtain a housing manufactured in the present comparative example. The bottom plate and the middle frame of the housing formed an obvious connection interface, and large-area bubbles and magic color were generated, as shown in FIG. 2 specifically.

Comparative Example 2

In the comparative example, a middle frame blank was sapphire, and a bottom plate was made of glass.

The bottom plate was machined from the glass plate through CNC. The middle frame with a target size was obtained from the sapphire plate through CNC.

The middle frame and the bottom plate were superposed, and welded at high temperature of 750° C. to obtain a housing manufactured in the present comparative example. An obvious connection interface was provided between edges of the bottom plate and the middle frame of the housing, and large-area bubbles and magic color were generated.

Comparative Example 3

In the present comparative example, a bottom plate was made of sapphire, a middle frame was made of glass, and an annular boss and a top lens of a camera were made of glass.

The shape of the bottom plate was machined from the sapphire plate through laser cutting, the annular boss was machined from a glass block through CNC, and the shape of the top glass lens was machined through CNC. The bottom plate was machined from the glass plate through CNC.

The annular boss and the lens were welded together at a high temperature of 700° C. under the pressure of 1.5 Mpa, and then welded with the bottom plate and the middle frame at 650° C. under the pressure of 5 Mpa. A device housing of the present comparative example was obtained, a contact surface of the annular boss and the lens had large-area magic color and bubbles, a contact surface of the annular boss and the bottom plate had an obvious connection interface, and a contact surface of the bottom plate and the middle frame had an obvious connection interface.

Comparative Example 4

In the present comparative example, a bottom plate blank was a high-alumina glass plate, a middle frame was made of sapphire, an annular boss of a camera was made of sapphire, and a top lens was made of glass.

The shape of the glass plate was machined through CNC, the shape of the annular boss was machined through CNC, the shape of the top lens was machined through CNC, and the middle frame was machined from the sapphire plate through laser cutting.

The annular boss and the lens were welded together at 650° C. under the pressure of 4 Mpa, and then welded together with the bottom plate and the middle frame at 700° C. under the pressure of 2 Mpa. A device housing of the present comparative example was obtained, a contact surface of the annular boss and the lens had large-area magic color and bubbles, a contact surface of the annular boss and the bottom plate had an obvious connection interface, and a contact surface of the bottom plate and the middle frame had an obvious connection interface.

Comparative Example 5

The housing was manufactured according to the method in Embodiment 1, except that the middle frame and the bottom plate were bonded by using a PVB film. A specific step includes the following operations:

The PVB film was arranged between the middle frame and the bottom plate, and fused at 110° C. under 2 MPa. The camera lens was welded at the camera hole of the bottom plate at 500° C. under 2 MPa. A housing manufactured in the present comparative example was obtained. The bottom plate and the middle frame of the housing were connected by a PVB film adhesion portion, interface-free continuous connections were provided between an edge of the camera lens and an edge of the camera hole, and the housing had a visual effect and a touch hand feeling similar to those of an all-glass or all-sapphire housing.

Test Embodiments

The performances of the housings manufactured in Embodiments 1-4 and Comparative Examples 1-5 were tested. The light transmittance was tested according to a light transmittance meter method, the percent of scattered light was tested according to a glossmeter diffuse reflectance calculation method, and the bending strength was tested according to a four-point bending resistance method, the results being shown in Table 1.

The bonding strengths between the bottom plate and the middle frame and between the boss and the camera lens were tested according to a pull force test method. When the bonding strengths between the bottom plate and the middle frame and between the annular boss and the camera lens were tested according to the pull force test method for the housings in Embodiments 1-4, a glass piece was first broken with the increase of an applied pull force, while a bonding position did not change, indicating that the bonding strength at the bonding position was greater than the pull strength of the glass piece. When the bonding strengths between the bottom plate and the middle frame and between the annular boss and the camera lens were tested according to the pull force test method for the housings in Comparative Examples 1-4, a glass piece was first broken with the increase of an applied pull force, while the housing in Comparative Example 5 was broken at a bonding position, indicating that the bonding strength at the bonding position was smaller than the pull strength of the glass piece.

As can be seen from Table 1, the electronic device housing of the present disclosure is high in hardness, wear-resistant, high in bending strength, not easy to deform structurally, and high in light transmittance, has no obvious magic color and bubbles at a composite position, and has excellent performance.

TABLE 1

| Sample | Transmittance (%) | Visual effect | Percent of scattered light (%) | Bending strength (MPa) |
|---|---|---|---|---|
| Embodiment 1 | 84 | No obvious magic color and bubbles at a composite position | <2.0 | 752 |
| Embodiment 2 | 82 | No obvious magic color and bubbles at a composite position | <2.0 | 855 |
| Embodiment 3 | 83 | No obvious magic color and bubbles at a composite position | <2.0 | 850 |
| Embodiment 4 | 81 | No obvious magic color and bubbles at a composite position | <2.0 | 863 |
| Comparative Example 1 | 75 | Magic color and bubbles at a composite position | <2.0 | 650 |
| Comparative Example 2 | 77 | Magic color and bubbles at a composite position | <2.0 | 648 |
| Comparative Example 3 | 75 | Magic color and bubbles at a composite position | <2.0 | 644 |
| Comparative Example 4 | 76 | Magic color and bubbles at a composite position | <2.0 | 651 |
| Comparative Example 5 | 74 | No obvious magic color and bubbles at a composite position | <2.0 | 610 |

The implementations of the present disclosure are described in detail above with reference to the accompanying drawings. However, the present disclosure is not limited to the specific details in the foregoing implementations, a plurality of simple deformations may be made to the technical solution of the present disclosure within a range of the technical concept of the present disclosure, and these simple deformations fall within the protection scope of the present disclosure.

It should be further noted that the specific technical features described in the above specific implementations may be combined in any suitable manner without contradiction. To avoid unnecessary repetition, various possible combinations are not further described in the present disclosure.

In addition, different implementations of the present disclosure may also be arbitrarily combined without departing from the idea of the present disclosure, and these combinations shall still be regarded as content disclosed in the present disclosure.

What is claimed is:

1. A method for manufacturing an electronic device housing, comprising:
    cleaning surfaces of components to be welded to obtain surface-cleaned components, and
    assembling, pre-pressurizing, and welding the surface-cleaned components, to make the connection between the components to be welded continuous and interface-free,
    wherein the component to be welded comprises at least a middle frame and a bottom plate, the middle frame is made of glass, and the bottom plate is made of sapphire; or the bottom plate is made of glass, and the middle frame is made of sapphire.

2. The method according to claim 1, wherein the component to be welded further comprises at least a camera lens and an annular boss.

3. The method according to claim 2, wherein the method further comprises: welding the camera lens on the annular boss to obtain a camera structure, and then welding the camera structure and the bottom plate, so that the camera structure is bonded at a camera hole formed in the bottom plate, the annular boss being made of sapphire or glass.

4. The method according to claim 1, wherein:
    the surface cleaning comprises: cleaning the components to be welded with a cleaning agent respectively, and then cleaning the components to be welded with pure water;
    the cleaning agent comprises a surfactant, an emulsifier, and a strong base, wherein the surfactant comprises at least one of sodium dodecyl benzene sulfonate, sodium dodecyl sulfonate, and sodium dodecyl sulfate, the emulsifier comprises triethanolamine, the strong base comprises at least one of sodium hydroxide, potassium hydroxide, and calcium hydroxide, and a weight ratio of the surfactant to the emulsifier to the strong base is 1:(0.2-2):(0.5-5).

5. The method according to claim 1, wherein the welding conditions comprise: the temperature is 400-800° C., the pressure is 0-5 MPa, and the time is 6-12 hours.

6. An electronic device housing manufactured using the method according to claim 1.

* * * * *